United States Patent
Swaminathan et al.

(10) Patent No.: US 11,120,363 B2
(45) Date of Patent: Sep. 14, 2021

(54) LATENCY MITIGATION FOR ENCODING DATA

(71) Applicant: ADOBE INC., San Jose, CA (US)

(72) Inventors: Viswanathan Swaminathan, Saratoga, CA (US); Saayan Mitra, San Jose, CA (US)

(73) Assignee: ADOBE INC., San Jose, CA (US)

( * ) Notice: Subject to any disclaimer, the term of this patent is extended or adjusted under 35 U.S.C. 154(b) by 938 days.

(21) Appl. No.: 15/788,455

(22) Filed: Oct. 19, 2017

(65) Prior Publication Data

US 2019/0122137 A1   Apr. 25, 2019

(51) Int. Cl.
*G06N 20/00* (2019.01)
*H04N 19/94* (2014.01)

(52) U.S. Cl.
CPC ............ *G06N 20/00* (2019.01); *H04N 19/94* (2014.11)

(58) Field of Classification Search
CPC ............................... G06N 20/00; H04N 19/94
See application file for complete search history.

(56) References Cited

U.S. PATENT DOCUMENTS

| | | |
|---|---|---|
| 5,488,365 A | 1/1996 | Seroussi et al. |
| 5,563,593 A | 10/1996 | Puri |
| 5,684,865 A | 11/1997 | Mohtashemi et al. |
| 5,717,951 A | 2/1998 | Yabumoto |
| 5,909,693 A | 6/1999 | Martini |
| 6,378,031 B1 | 4/2002 | Kuno et al. |
| 6,421,467 B1 | 7/2002 | Mitra |
| 6,717,990 B1 | 4/2004 | Abousleman |
| 6,993,536 B2 | 1/2006 | Yamanaka |
| 7,009,949 B1 | 3/2006 | Gopalakrishnan et al. |
| 7,613,738 B2 | 11/2009 | Patel et al. |
| 7,630,902 B2 | 12/2009 | You |
| 7,831,130 B2 | 11/2010 | Takada |

(Continued)

OTHER PUBLICATIONS

Zhang, Chunjie, et al. "Beyond explicit codebook generation: Visual representation using implicitly transferred codebooks." IEEE Transactions on Image Processing 24.12 (2015): 5777-5788. (Year: 2015).*

(Continued)

*Primary Examiner* — Benjamin P Geib
(74) *Attorney, Agent, or Firm* — Shook, Hardy & Bacon, L.L.P.

(57) ABSTRACT

Embodiments of the present disclosure provide systems, methods, and computer storage media for mitigating latencies associated with the encoding of digital assets. Instead of waiting for codebook generation to complete in order to encode a digital asset for storage, embodiments described herein describe a shifting codebook generation and employment technique that significantly mitigates any latencies typically associated with encoding schemes. As a digital asset is received, a single codebook is trained based on each portion of the digital asset, or in some instances along with each portion of other digital assets being received. The single codebook is employed to encode subsequent portion(s) of the digital asset as it is received. The process continues until an end of the digital asset is reached or another command to terminate the encoding process is received. To encode an initial portion of the digital asset, a bootstrap codebook can be employed.

15 Claims, 5 Drawing Sheets

(56) References Cited

U.S. PATENT DOCUMENTS

| | | | |
|---|---|---|---|
| 8,185,924 | B2 | 5/2012 | Kikkoji et al. |
| 8,392,705 | B2 | 3/2013 | Borden et al. |
| 9,064,161 | B1 | 6/2015 | Boman et al. |
| 9,972,325 | B2 | 5/2018 | Gao |
| 2003/0103667 | A1 | 6/2003 | Soliman |
| 2003/0147561 | A1 | 8/2003 | Faibish |
| 2004/0001408 | A1 | 1/2004 | Propps et al. |
| 2004/0174278 | A1 | 9/2004 | Kadono et al. |
| 2005/0071744 | A1 | 3/2005 | Dunbar et al. |
| 2005/0114290 | A1 | 5/2005 | Borthakur et al. |
| 2005/0132161 | A1 | 6/2005 | Makela et al. |
| 2008/0031601 | A1 | 2/2008 | Hashimoto et al. |
| 2010/0138393 | A1 | 6/2010 | Crescenti et al. |
| 2010/0138396 | A1 | 6/2010 | Kikkawa |
| 2011/0006931 | A1 | 1/2011 | Sun |
| 2011/0087768 | A1 | 4/2011 | Wu et al. |
| 2014/0258652 | A1 | 9/2014 | Vishniac et al. |
| 2015/0332690 | A1* | 11/2015 | Kim .................. G10L 19/008 704/222 |
| 2016/0019898 | A1 | 1/2016 | Schreiner et al. |
| 2016/0065961 | A1 | 3/2016 | Whillock et al. |
| 2016/0156940 | A1* | 6/2016 | Swaminathan ...... H04N 19/625 375/240.22 |
| 2017/0063392 | A1 | 3/2017 | Kalevo et al. |
| 2017/0155906 | A1 | 6/2017 | Puri |

OTHER PUBLICATIONS

Chen, Hsiu-Niang, and Kuo-Liang Chung. "Improved adaptive vector quantization algorithm using hybrid codebook data structure." Real-Time Imaging 11.4 (2005): 270-281. (Year: 2005).*

First Action Interview Office Action dated Apr. 20, 2020 in U.S. Appl. No. 15/788,146.

Pre-Interview First Office Action dated Dec. 2, 2019 in U.S. Appl. No. 15/788,146. 4 pages.

Final Office Action dated Jul. 21, 2020 in U.S. Appl. No. 15/788,146. 15 pages.

Non-Final Office Action dated May 29, 2020 in U.S. Appl. No. 15/788,481.

Non-Final Office Action dated Sep. 6, 2017 in U.S. Appl. No. 14/964,715, 10 pages.

Blelloch, Guy E., "Introduction to Data Compression," Computer Science Department, Carnegie Mellon University, Jan. 31, 2013. 55 pages.

Blelloch, Guy, "Algorithms in the Real World: Lecture Notes (Fall1997)," Apr. 23, 1998. 303 pages.

Shah Bahram I, et al., "Evaluation of Huffman and Arithmetic Algorithms for Multimedia Compression Standards," Retrieved from the Internet—Nov. 1, 2015. URL: htlp://arxiv.org/flp/arxiv/papers/1109111 09.02.6.pdf. 11 pages.

Wagner, David, "CS 170: Efficient Algorithms and Intractable Problems," Handout 16, UC Berkeley, Apr. 1, 2003. 4 pages.

Lu, Z. M., and Li, Z., "Dynamically restricted codebook-based vector quantisation scheme for mesh geometry compression," Signal Image and Video Processing, pp. 251-260, (Feb. 19, 2008).

Final Office Action dated Sep. 18, 2020 in U.S. Appl. No. 15/788,481, 10 pages.

Notice of Allowance dated Nov. 4, 2020 in U.S. Appl. No. 15/788,146, 9 pages.

Notice of Allowance dated Feb. 18, 2021 in U.S. Appl. No. 15/788,481, 9 pages.

Notice of Allowance dated Apr. 29, 2021 in U.S. Appl. No. 15/788,481, 9 pages.

* cited by examiner

LATENCY MITIGATION FOR ENCODING DATA

CROSS-REFERENCE TO RELATED APPLICATIONS

This application is related by subject matter to and has the same priority date as U.S. Non-Provisional patent application Ser. No. 15/788,146, entitled "LATENCY OPTIMIZATION FOR DIGITAL ASSET COMPRESSION," and U.S. Non-Provisional patent application Ser. No. 15/788,481, entitled "EMBEDDING CODEBOOKS FOR RESOURCE OPTIMIZATION," each assigned or under obligation of assignment to the same entity as this application, the entire digital assets of each being incorporated by reference herein. This application is also related by subject matter to U.S. Pat. No. 9,277,234, filed Aug. 27, 2014, U.S. Pat. No. 9,281,838, filed Feb. 11, 2015, and U.S. Pat. No. 9,591,334, filed Jan. 20, 2016, each entitled "COMMON COPY COMPRESSION" and assigned or under obligation of assignment to the same entity as this application, the entire contents of each being herein incorporated by reference.

BACKGROUND

Consumer access to digital media has progressively moved towards server-based storage solutions, otherwise known as the "cloud." Consumers benefit from having a single access point for storing and accessing digital media because they are no longer required to maintain separate copies of the digital media over multiple devices. Cloud service providers, however, must maintain and distribute the digital media for each licensed consumer. As cloud-based solutions become ubiquitous, so do the complexities of hosting and processing massive amounts of data. More specifically, the intricacies associated with hosting multitudes of digital media copies, while staying within the parameters of copyright laws and digital media licensing requirements, present new and unforeseen technical challenges. More specifically, the processing demands associated with hosting large quantities of digital media can be resource intensive, with processing demands continuously increasing in accordance with the rapidly-increasing numbers and sizes of digital media files. A failure to keep up with the increasing processing demands, such as those associated with encoding and decoding, introduces undesirable strain on cloud-based systems. The described legal and technical challenges together introduces a new array of problems that cloud-service providers need to address effectively.

SUMMARY

Embodiments of the present disclosure relate to encoding latency mitigation. More specifically, systems and methods are disclosed relating to the mitigation of latencies associated with the encoding of digitals assets, such that digital assets can be encoded, stored, and retrieved with minimal delay.

In an embodiment, a computing device, such as a cloud server, receives a digital asset to store thereon. A first codebook employable for encoding (e.g., compressing) data is trained, or in other words generated, by the computing device as a first portion of the digital asset is received. In other words, the computing device trained the first codebook, in real-time, based on an already-received part of the first portion. Once trained, the first codebook is employed by the computing device to encode a second portion of the digital asset as the second portion is received. In this regard, as a portion of the digital asset is received, a new codebook is trained based on one or more received parts of that portion, and the new codebook is employed to encode a subsequent portion of the digital asset. This offset training and encoding technique facilitates the immediate encoding and storage of incoming digital assets, such as live content, and further facilitates near real-time playback features. As portions of a digital asset are encoded (e.g., compressed), the encoded portions can be joined together as a single encoded digital asset and stored in a memory. In embodiments, the encoded digital asset has a cumulative file size that is substantially smaller than a sum of file sizes associated with the received portions of the digital asset. This size reduction can provide a substantial savings in storage capacity requirements. In some embodiments, the encoded digital asset is decoded with one or more of the trained codebooks to recover the digital asset, also with minimal delay.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present disclosure is described in detail below with reference to the attached drawing figures, wherein.

DETAILED DESCRIPTION

Figure 1:
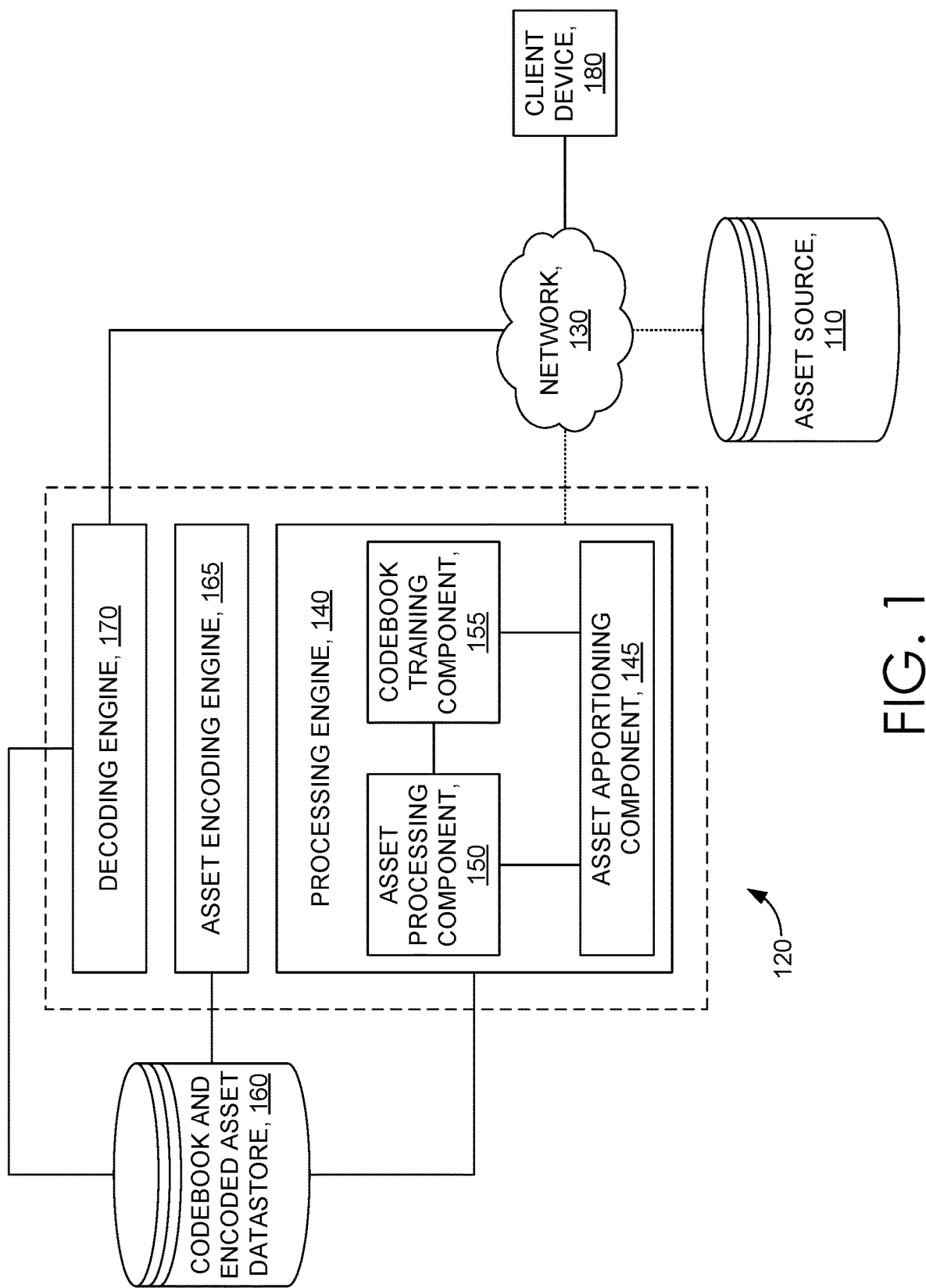
FIG. 1 depicts an exemplary operating environment including an asset processing engine in accordance with an embodiment of the present disclosure.

As digital data storage moves aggressively toward server-based "cloud" solutions, digital media service providers have harnessed the benefits of cloud-based storage solutions, providing consumers with single point-of-access storage solutions to store and access digital assets. Oftentimes, cloud-based digital media solutions, such as cloud-based television, digital video recording (DVR), movie rental, radio, podcasts, and the like, all provide multiple users with on-demand access to digital assets. The ever-increasing demand for cloud-based digital asset storage and access results in new technical complexities that service providers must address in efforts to stay ahead of the storage space requirements curve.

With regard to features that require real-time recording, such as DVR, proper upkeep of processing resources and storage space is not only a challenge that service providers must address. These technical complexities have a direct effect on recording and playback speeds that are essential to the user experience. That is, when users pause or record a particular show, for example, the ability to instantly rewind, pause, or fast-forward the show from the time the pause or record operation was initiated is a baseline expectation. Unreasonable delays incurred when performing such operations may present an unacceptable consumer experience. Additionally, delays associating with encoding (i.e., compressing) a show for storage (e.g., recording) can introduce operational inefficiencies, such as buffering media streams before the encoding process begins. Typically, buffering is an undesirable side effect of training a codebook based on the media stream being recorded. To facilitate the mitigation of latencies related to the encoding of digital assets for immediate storage or access, techniques are disclosed that employ a new "moving window" (e.g., segmented) codebook training and encoding approach.

As one or more new digital assets are received, new codebooks can be trained based on segments of the one or more digital assets "on the fly." Each new codebook can effectively be employed to encode a subsequently-received segment of the digital asset. To provide a better overview of the "moving window" approach, segment(s) from one or more digital assets are processed in real-time to train one or more new codebooks based thereon, to be immediately employed for encoding subsequent segment(s) of the one or more digital assets. In other words, as one or more segment(s) of one or more digital assets are received (e.g., via a live stream), a codebook can be trained based entirely on, or even partially on, the one or more received segment(s). When the next segment(s) of the one or more digital assets are received, the codebook trained based on the previously-received segment(s) can be employed to encode these next segment(s) as they are received. In a preferred embodiment, the timeline (e.g., duration, starting time, ending time) of all digital assets are similar or the same when a plurality of digital assets is processed to train a codebook.

Each "current" segment (e.g., a segment being received) is encoded with a codebook trained from previous segment(s) of the one or more digital assets, while each codebook for a subsequent segment is trained as the current segment(s) are received. Moreover, instead of waiting for the training of a codebook to begin encoding a new digital asset or new digital asset portion, a bootstrap codebook that was trained based on an earlier, similarly-encoded digital asset can be employed for a short duration, such that encoding of the new digital asset can begin immediately without delay. By virtue of employing a codebook trained based on content no less similar than itself, this approach not only provides an efficient rate of compression, but also mitigates the latencies typically associated with encoding live media. To this end, embodiments of the present disclosure provide, among other things, techniques to mitigate latencies between codebook training start times and encoding start times.

Various terms are used throughout this description. Although more details regarding various terms are provided throughout this description, general definitions of some terms are included below to provider a clearer understanding of the ideas disclosed herein:

As used herein, a "digital asset" generally refers to an electronic data file. In some cases, a digital asset can be a media file or media stream, such as an image, video, and/or audio file or stream. In other cases, a digital asset can be a data file, application, game, or any other digital data file or stream. A digital asset can include presentations (e.g., media) licensed or owned by any number of users. For instance, the digital asset can be a digital recording or stream of a television show or movie.

A digital asset can have any number of "asset characteristics" associated therewith. An asset characteristic of a digital asset can include any characteristic of the digital asset file, the digital asset metadata, or the digital asset content. By way of example only, a digital asset file can have a file name, an extension, or any other identifiable characteristics. In another example, the digital asset metadata can reference content genre, content type (e.g., category, rating), content title, content source (e.g., place of origin), resolution, bitrate, encoding type, encoding source (e.g., software, hardware), entropy coding scheme, encoding type, codec, source channel (e.g., streaming source), and the like. Further, the digital asset content can include determinable characteristics, such as a motion vector schema, a discrete cosine transform (DCT) coefficient, additional metadata, and the like. It is contemplated that the digital asset file, metadata, and content can include any one or more of the identifiable or determinable characteristics described above in a non-limiting manner, including those not described herein.

As used herein, "training" a codebook based on data (e.g., a digital asset) is the process of applying a specific code or algorithm to the data for conversion. In some cases, the process of training a codebook can include an encoding process—generating smaller identifiable data pieces from a digital asset. The data pieces can be individually unique (e.g., index files, residual files) and/or commonly used by other data pieces (e.g., a codebook). In other cases, training can include parsing or extracting a common data piece (e.g., a codebook) and a plurality of unique data pieces (e.g., index files, residual files), both the common and unique data pieces being smaller in size than the original digital asset. In some other cases, training can also generate, parse out, or extract a residual data piece for each digital asset.

As used herein, "encoding," also known as compression, refers to the process of modifying or converting the bits structure of data in such a way that it consumes less space on disk. In some cases, compression can be lossless, such that no information is discarded as a result of the algorithm used when encoding. In other cases, compression can be lossy, such that the algorithm looks for recurring patterns in a data file and permanently replaces occurrences of the recurring pattern portions with short abbreviations, thereby reducing the file size. When a lossy file is uncompressed, however, only a part of the original information remains. Depending on an acceptable rate of loss, a trade-off must be made between file size and media quality. In various embodiments, a codebook trained from an asset can be employed to encode additional copies of the asset, or in some cases, different assets having similar content characteristics.

On the other hand, "decoding" is the reverse process of encoding. Decoding converts encoded data back to its original state. In other words, the process of decoding reconstructs a data file (e.g., a digital asset) by merging together smaller identifiable portions (also referred to herein as "reconstructing"). The portions from which the data file is reconstructed can be individually unique and/or commonly used by other portions. In some embodiments, data that was encoded based on a codebook can also be decoded with reference to the codebook.

A "codebook" generally refers to a set of parameters used to decode data, and in some instances, facilitate the encoding (e.g., compressing) of data. In more detail, the codebook is a collection of parameters, also known as code words. A code word refers to a codebook vector determined to be the closest vector in Euclidean distance from the input vector. The codebook can be used to reference the portion of a digital asset that is common to a plurality of index files. As will be described, the codebook can be used with a corresponding index file for decoding and reconstructing the digital asset. However, in some implementations, such as vector quantization by way of example, a codebook can be used for data encoding.

As used herein, "extracting" refers to the process of separating portions of data from a plurality of digital assets based on similarities and/or differences between the digital assets. On a very high level, extraction can be performed by comparing each copy to one another to determine the commonalities there between, followed by dissecting the common portions from each copy to determine and generate a common data piece. As such, the remaining portions from each copy remain as the individual data piece. In some other aspects, extraction can be performed by recursive algorithms, which extract and build portions of index files, as digital assets are compared to one another. As such, after recursively traversing through each digital asset, a codebook can be trained as a result of the comparison and extraction process. Other algorithms and processes for generating codebooks and index files are considered within the scope of the present disclosure.

"Vector quantization" is a process of encoding (i.e., compressing) a digital asset into smaller data portions. More particularly, the process encodes a large set of input vectors by finding a smaller set of representative codebook vectors that provide an approximation to the original input space. In some cases, representative codebook vectors can be determined using a nearest neighbor condition, where the encoding region should consist of all vectors that are closer to a particular codebook vector than any other codebook vector. In some other cases, representative codebook vectors can be determined based on a centroid condition, where a particular codebook vector should be the average of all vectors that are in an encoding region. In various embodiments, the determination of representative codebook vectors utilizing the nearest neighbor condition and the centroid conditions can be made in an alternating manner. In some instances, Vector quantization can encode data to encode data into smaller portions (e.g., a codebook and an index file), where a sum of the smaller portions is less than a size of the data prior to encoding.

An "index file" generally refers to a collection of indices for referencing the codebook. In more detail, the index file includes code word indices that offer the lowest amount of distortion. The index file can be used to represent a single copy of a digital asset. In some implementations, the index file can be used with a codebook to decode and reconstruct the digital as set.

A "residual error" refers to portions of the digital asset input vectors that potentially may not be stored in the codebook as a result of input vector decomposition during vector quantization. In some implementations, residual errors can still be used with a codebook and an index file to decode and reconstruct a digital asset. Residual errors are generally produced as a result of encoding a digital asset using lossy compression schemes, such as vector quantization.

As used herein, "common copy compression" refers to a process of breaking down one or more digital asset data files into a single set of codebooks and individual index files corresponding to the one or more digital asset data files. Both the set of codebooks and the individual index files are smaller than the digital assets from which they were generated. As described herein, a codebook can be shared by multiple index files, whereas the index files are separate data pieces that each represent a different digital asset. In some aspects, a group of digital assets can share a codebook and have a separate index file corresponding to and representing the digital asset. One solution for encoding many digital assets with a single codebook to save storage space, among other things, has been developed by Adobe Systems, Inc., described in U.S. Pat. Nos. 9,727,234, 9,591,334, and 9,281, 838, each having the title "Common Copy Compression."

A "compression ratio" generally refers to a value for determining the amount of compression applied to a digital asset. The compression ratio can be a value that is predetermined, input by an administrator, or calculated by a computing device. The compression ratio can affect the size of the codebook and/or index files produced by the common copy compression algorithm. The compression ratio can be a value, percentage, or fraction representative of an amount of compression to-be-performed by the computing device. In various embodiments, compression ratios can vary and correlate to differently-sized codebooks and index files. For example, a compression ratio can be a number on a compression scale of 1 to 10, with 1 being minimal compression resulting in a large codebook with large index files, and 10 being maximum compression resulting in a small codebook with small index files. Compression ratios can also be represented by percentage scales of 0% to 100%, by a fractional scale of 0/1 to 1/1, or any other representative relationship.

As used herein, the "cloud" refers to a wide area network (WAN) commonly depicted as a cloud, often referring to the Internet, and more precisely to a datacenter full of servers connected thereto. In some cases, the cloud can be the Internet, a local area network (LAN), a wide area network (WAN), or any combination thereof.

Turning now to FIG. 1, a schematic depiction is provided illustrating one exemplary operating environment 100 of which an embodiment of the present disclosure can be employed. It should be understood that this and other arrangements described herein are set forth only as examples. Other arrangements and elements (e.g., machines, interfaces, functions, orders, groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The operating environment 100 of FIG. 1 includes an asset source 110 that communicates one or more digital assets (not shown) to a server 120 via a network 130. Each asset provided by the asset source 110 includes a respective piece of electronic content (e.g., a television show, a movie, a cartoon) and is associated with a channel, such as a live broadcast station, a live digital media stream, or other categorized (e.g., having metadata indicating a recognizable source) means of providing media to a client device for presentation and consumption. The assets are received by the server 120 to be stored, or in essence, recorded in memory for one or more users or user accounts associated therewith. By way of example only, a user employing a client device 180 may have transmitted to the server 120, from the client device 180, a request to record (e.g., DVR) a particular show for the user at a particular time. In this regard, the server 120 will perform an operation to "record" a particular asset that corresponds to the particular show, preferably at the designated time. It is contemplated that the assets are in a digital format, and received (e.g., streamed) through a network 130. It is also contemplated that the received digital asset can already be encoded. Although not shown, the assets can also be received as another type of signal (e.g., analog) and converted to a digital signal by way of a digital converter box (not shown), such as a digital tuner. In such circumstances, it is contemplated that the analog signal would not necessarily be received by the server via network 130, but by some other means, such as an antenna coupled to the digital converter and server 120, although other configurations are certainly considered within the purview of the present disclosure.

The server 120 includes an processing engine 140 that can process (e.g., analyze, parse) one or more digital assets to train and in effect generate one or more codebooks, employ the one or more corresponding codebooks to encode (e.g., compress) the corresponding digital asset(s), and store the encoded digital asset(s). By employing an asset apportioning component 145, an asset processing component 150, and a codebook training component 155, the processing engine 140 can immediately begin encoding a digital asset as it is received, thereby mitigating latencies typically associated with codebook generation prior to encoding.

The asset apportioning component 145 includes a cache memory that temporarily stores incoming data associated with the incoming one or more digital assets. The asset apportioning component 145 can facilitate, among other things, a segmentation of each incoming digital asset in equal or substantially equal portions. In other words, the asset apportioning component 145 can facilitate the apportionment of each digital asset, as it is received, into substantially equal portions based on a predefined period (e.g., every n-number of seconds). The apportioning can be performed virtually, by tracking the one or more digital assets periodically (e.g., at every predefined period), or in some instances by digitally tagging the one or more digital assets with an indicator (e.g., metadata) at every passing of the predefined period. It is also contemplated that the one or more digital assets can be physically divided into separate segments (e.g., files) as it passes through the asset apportioning component 145. More importantly, the asset apportioning component 145 manages the timing of the processing engine 140 and its components to train a codebook based on and/or encode different segments of one or more digital assets as they are received.

When one or more digital assets or one or more digital asset portions is first received by asset apportioning component 145, it is received in continuous sequential order. In other words, there is a temporal beginning and ending to each digital asset, just as a movie has a beginning and an end. Because the one or more digital assets is provided in real-time, a constant stream of data is being received by the asset apportioning component 145 in sequential order. In this regard, when a beginning of each asset is first received, the asset apportioning component 145 will begin its management role of providing a first received portion of the one or more digital assets to both the asset processing component 150 and the codebook training component 155. With the continuous flow of data being received by the asset apportioning component 145, subsequent portions or segments will be provided in sequential order to both the asset processing component 150 and codebook training component 155 as well. The asset apportioning component 145 will continue this role until, for instance, an end of the one or more digital assets is received, or when a received command (e.g., a stop recording operation from user device 180) or rules-based operation (e.g., recording is to stop at 4:00 PM) instructs the processing engine 140 to discontinue the encoding process, by way of example.

As noted, each of the asset processing component 150 and codebook training component 150 are continuously provided, based at least in part on the predefined period, with sequential portions of the one or more digital assets. Starting with the beginning portion of the one or more digital assets, the asset processing component 150 employs a codebook to begin encoding (e.g., compressing) each received portion. To maximize encoding quality and efficiency, a codebook that was trained based on similar content can provide the best means for encoding the digital content.

As conventional systems do not have a codebook readily available to encode the beginning portion of a digital asset, such systems may employ various techniques to train a suitable codebook to encode the beginning portion, thereby causing undesirable latency (e.g., buffering). To resolve this issue, the asset processing component 150 retrieves one or more codebooks from the codebook and encoded asset data store 160. The codebook and encoded asset data store 160 can include a memory or a database-like structure that stores previously-trained codebooks, among other things. In this regard, the asset processing component 150 would be best suited to identify one or more "bootstrap" codebooks that were trained based other digital assets having similar content as the incoming one or more digital assets, such as a previously-aired episode of the one or more digital assets. The asset processing component 150 can immediately employ the bootstrap codebook(s) to encode each beginning portion as it is received.

At the same time, the codebook training component 155 also receives the beginning portion of the incoming one or more digital assets from the asset apportioning component 145. The codebook training component 155 employs an encoding algorithm, such as vector quantization, to train a new codebook for each received beginning portion. The codebook training component 155 trains and thereby trains the new codebook based on the received beginning portion of the one or more digital assets. The new codebook, once trained, is then provided to the asset processing component 150 to subsequently encode a second portion of the one or more digital assets (e.g., a portion subsequent or immediately subsequent to the beginning portion). As the asset apportioning component 145, asset processing component 150, and codebook training component 155 are performing their described operations, it is contemplated that each component is operating on the incoming portions of the one or more digital assets in parallel and preferably in real-time.

The process continues, such that immediately or soon after each beginning portion is encoded by asset processing component 150 employing a corresponding bootstrap codebook, the asset processing component 150 receives one or more newly-trained codebooks from the codebook training component 155. The asset processing component 150 then employs each new codebook to encode a second (e.g., subsequent or immediately subsequent) portion of the one or more digital assets as it is received from the asset apportioning component 145. The terms "as it is received," "as the portion is received," and "as the subsequent portion is received," or any variation thereof utilized throughout the present disclosure, are not intended to be limiting in any way, and no temporal restriction is intended with regard to these terms. In other words, data that has been or is being collected and/or cached to be processed can also be considered within the scope of these terms.

At the same time, the codebook training component 155 also receives a second portion of each of the one or more digital assets from the asset apportioning component 145. The codebook training component 155 can begin generating yet one or more new codebooks based on, or in response to, the received one or more second portions. Upon completion of the encoding by asset processing component 150 and codebook training by codebook training component 155, each of the asset processing component 150 and the codebook training component 155 receive one or more subsequent portions of the one or more digital assets digital assets, while each newly-trained codebook is passed from the codebook training component 155 to the asset processing component 150 to restart the described process repeatedly until either the processing engine 140 receives an instruction to stop the encoding process, when a determination is made that the one or more digital assets has reached an ending point, or another rules-based operation is executed.

In some embodiments, the server 120 can include a decoding engine 170 that decodes a particular one or more digital assets in response to a request to provide the one or more digital assets to a client device, such as client device 180. By way of example, the client device 180 can communicate a request to the server 120 to retrieve a particular "recorded" (e.g., encoded, stored) one or more digital assets associated with an account. The server 120 can employ the decoding engine 170 to retrieve one or more corresponding codebook(s) and index file(s) that correspond to the requested one or more digital assets. The decoding engine 170 can employ the retrieved codebook(s) to decode the index file(s) that correspond to the requested one or more digital assets, and communicate the reconstructed one or more digital assets to the client device 180, preferably via a stream over the network 130.

In some embodiments, the exemplary operating environment illustrated in FIG. 1 can include a plurality of client devices 180 that can request and access digital assets from the server 120 over the network 130. Examples of the network 130 include, but are not limited to, Internet, local area network (LAN), wireless area network, wired area network, wide area network, and the like. A user of a client device 180 can employ various products, applications, or services supported by the client device 180 to facilitate communication to and from the server device 120. Any of these products, applications, or services can be executed directly on the client device 180 and/or accessed via the network 130 (e.g., employing an application remotely accessible by the client device and from the server 120). Examples of the client device includes, but is not limited to, a personal computer (PC), tablet computer, a mobile computer, a smartphone, a desktop computer, a head-mounted display, a processing unit, any combination of these devices, or any other suitable device having one or more processors.

In some embodiments, the asset source 110 can include digital assets that are, among other things, broadcasts, streams, source files, any other media format or real-time media, or any combination of the foregoing. In further embodiments, the exemplary operating environment illustrated in FIG. 1 can include a plurality of asset sources 110, and any combination of the asset sources 110 can be coupled to the server 120 via the network 130, wirelessly, wired, or any combination thereof.

In some embodiments, the server 120 can provide a "cloud" storage and access service to the client devices 180, and incorporate, among other things, the processing engine 140 to encode the hosted digital assets. In further embodiments, the server 120 can also incorporate a decoding engine 170 to decode the hosted digital assets and provide (e.g., stream) the decoded (e.g., reconstructed) one or more digital assets to a client device 180 in response to a request, received from the client device 180, to view the one or more digital assets. In some embodiments, the server 120 can include one or more computing devices (e.g., servers) that can mitigate latencies associated with codebook training and asset encoding by employing various embodiments of the processing engine 140 described herein. Although the description provided herein is generally directed to a processing engine 140 employing a codebook generation and/or encoding technique based on vector quantization, it is contemplated that the described systems and methods can also incorporate other types and combinations of codebook generation and/or encoding algorithms.

Figure 2:
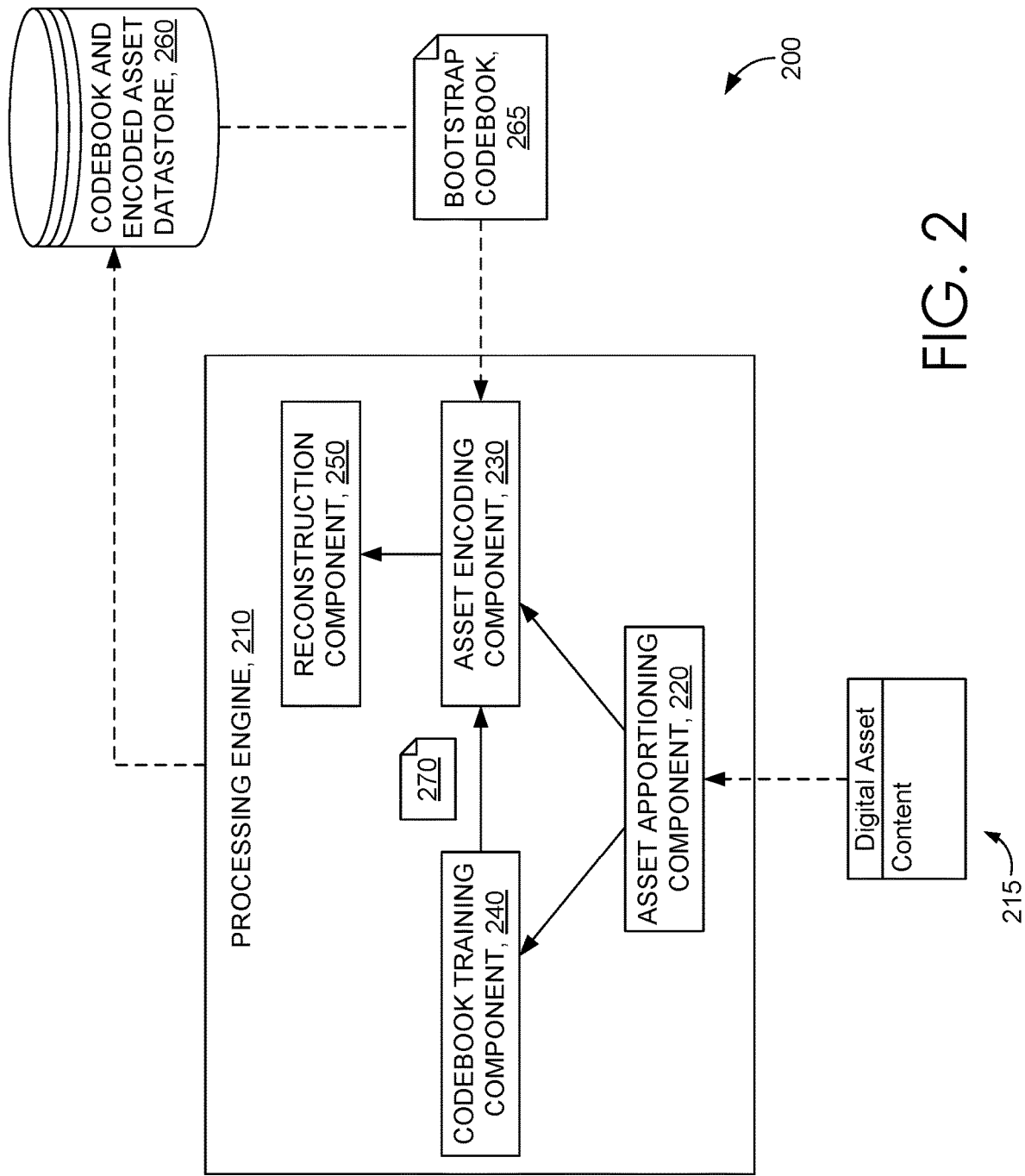
FIG. 2 is a block diagram illustrating an exemplary implementation of an asset processing engine in accordance with an embodiment of the present disclosure.

Referring now to FIG. 2, a block diagram 200 is provided illustrating a system component in accordance with some embodiments of the present disclosure, particularly for optimizing codebook generation latency to expedite the encoding and storage of digital assets as they are received. The block diagram 200 depicts an exemplary implementation of the processing engine 210 in accordance with another embodiment disclosed herein. It is noted that the depicted implementation is merely exemplary, and not intended to be limiting in any way, as each component can be arranged in various configurations, spread across a number of computing devices, combined with other components or one another, arranged to communicate directly, wirelessly, over a network, or any combination of the foregoing including others not mentioned.

As described herein, one or more servers, such as server 120 of FIG. 1, can include a processing engine 210 for mitigating codebook generation latency before encoding one or more digital assets, among other things. The processing engine 210 can include various components, such as an asset apportioning component 220, an asset processing component 230, a codebook training component 240, and a reconstruction component 250, among other things, that can receive one or more digital assets, train codebook(s) based on and/or encode the received one or more digital assets as they are received (preferably in real-time), or reconstruct the one or more digital assets after having been encoded. As described herein, a segmented approach of periodically processing (e.g., analyzing, parsing) sequential portions of digital assets can facilitate the training of codebooks "on the fly," which can be employed to encode any corresponding portion of the digital assets with minimal to no latency.

In some embodiments, the processing engine 210 can receive one or more digital assets 215 in a continuous matter, such as via a corresponding media stream (e.g., continuous network connection) transmitting a particular piece of content. Generally speaking, the processing engine 210 is employed in a server, such as server 120 of FIG. 1, to train one or more codebooks based on one or more digital assets, and to encode the one or more digital assets for storage (i.e., record). The processing engine 210 can be initialized to record one or more particular digital assets in response to received instruction(s) or defined rule(s) to begin the encoding and storage of each digital asset, which in some implementations, can also include a timeframe (e.g., a start time and an end time) during which the recording is to be performed.

As described, the content included in each digital asset can relate to a show, a movie, a newscast, a cartoon, or any other digital media desired to be stored in memory. In some embodiments, like many electronic data files, a digital asset 215 can have metadata associated therewith. The metadata can include identifying information, such as a source channel or stream, a content title, a rating, a genre, or any other characterizing information relating to the content included therein. It is further contemplated that the metadata of a digital asset 215 can include, among other things, a content genre, a content type, a content producer, or a recognizable relationship or similarity to other content (e.g., a prequel, sequel, an episode number, a series or volume number, a year, a network or channel association, a content title, a content source, a resolution, a bit rate, an encoding type, an encoding source, an entropy coding scheme, an encoding type, a codec, an associated channel or stream, or any combination thereof, not excluding others examples not mentioned).

Moving on, the asset apportioning component 220 of the processing engine 210 can receive sequentially-ordered data associated with each digital asset 215. For instance, a digital asset can be a currently aired (e.g., "live") content, such as a football game. As such, the digital asset 215 can include the collection of data that corresponds to the content of interest (e.g., the football game), and can be defined as having a start time and an end time. It is contemplated that any type of content can be considered live content. For instance, a movie, show, newscast, weathercast, cartoon, or vlog, whether broadcast over the air, streamed over the internet, or digitally fed into the processing engine (e.g., via a digital converter box), can be considered live content by way of example. In other words, any form of content that is continuously and sequentially communicated (e.g., played, streamed, transmitted) from an earlier time to a later time, which must be visually consumable in the sequence based on the defined times, can be considered live content.

The asset apportioning component 220 can continuously receive each digital asset as it is being communicated to the processing engine 210. In an embodiment, the asset apportioning component 220 can split (e.g., partition) the sequentially-ordered data as it is provided to the processing engine 210, such that the codebook training component 240 and asset processing component 230 receive segments of the sequentially-ordered data as it is provided to the processing engine 210. In another embodiment, the asset apportioning component 220 can be a cache memory that receives the sequentially-ordered data as it is provided to the processing engine 210. In one aspect, the codebook training component 240 and asset processing component 230 can then simultaneously retrieve portions of the sequentially-ordered data as it is provided to or retrieved from the processing engine 210. In another aspect, the asset apportioning component 220 can provide the sequentially-ordered data to both the codebook training component 240 and asset processing component 230 in parallel. It is also contemplated that the components 230, 240 can retrieve the data from the asset apportioning component 220.

In further embodiments, the asset apportioning component 220 can apportion the sequentially-ordered data into segments as it is provided to the processing engine 210. The segments can be defined by a predefined period (e.g., n seconds), such that the sequentially-ordered data, within each period, is accompanied or tagged with a periodic notification. In this regard, the codebook training component 240 and asset processing component 230 can recognize the notification, and advance their operations onto the next segment of sequentially-ordered data. In other embodiments, the codebook training component 240 and asset processing component 230 can each receive the sequentially-ordered data of the incoming one or more digital assets 215 in parallel. Each of the codebook training component 240 and asset processing component 230 can be configured to simultaneously perform their respective tasks on portions of the incoming one or more digital assets 215 only for a predefined period of time before moving onto the next portion for the predefined period of time. Various techniques for apportioning sequentially-ordered data, such that the codebook training component 240 and asset processing component 230 perform their respective tasks simultaneously, preferably in real-time, and in an order defined by the incoming one or more digital assets 215, are features considered within the purview of the present disclosure.

As was described with respect to FIG. 1, the incoming one or more digital assets 215 has a beginning portion that corresponds to an encoding start time. That is, the initial portion of received sequentially-ordered data associated with each digital asset 215 corresponds to the beginning portion of the digital asset 215. When the processing engine 210 is initialized (e.g., when or soon after a beginning portion of each digital asset 215 is received), the processing engine 210 can retrieve, from codebook and encoded asset data store 260 and for the asset processing component 230, a corresponding bootstrap codebook 265 that is suitable for encoding each beginning portion of the one or more digital assets 215. The bootstrap codebook 265 can be identified in any number of ways. For instance, in some embodiments, an inspection of the digital asset metadata can be performed (e.g., by processing engine 210, codebook and encoded asset data store 260, or any other component) to identify characteristics associated with the incoming one or more digital assets, and subsequently match each incoming digital asset with a codebook that was trained based on at least one or more other digital assets having similar or common characteristics as the incoming digital asset.

By way of example, a digital asset 215 can be determined to include metadata that identifies a particular broadcast (e.g., Monday Night Football). In this regard, one or more codebooks associated with one or more already-encoded digital assets, both stored in the codebook and encoded asset data store 260 and having associated metadata commonly associating the already-encoded digital assets to the particular broadcast, can be retrieved for employment as a bootstrap codebook 265. It is contemplated that the bootstrap codebook 265 was trained based on the processing of one or more digital assets referencing the same or similar broadcast as the particular broadcast, will likely have similar digital asset characteristics (e.g., motion vectors, colors, scene changes, etc.) as the broadcast, and facilitate an efficient and effective encoding of at least the beginning portion of the incoming digital asset.

In another non-limiting example, each digital asset 215 can be determined to include metadata that identifies a particular episode of a series, or a particular movie of a trilogy, by way of example only. In this regard, one or more codebooks associated with one or more already-encoded digital assets, potentially being stored in the codebook and encoded asset data store 260 and having associated metadata commonly associating the one or more already-encoded digital assets to the digital asset 215, can be retrieved for employment as the bootstrap codebook 265.

Many variations and implementations for determining a suitable codebook (e.g., a bootstrap codebook 265) for encoding the beginning portion(s) of one or more incoming digital asset(s) 215 can be employed. A list of non-limiting examples for identifying a suitable codebook can include, among other things, identifying one or more stored codebooks associated with: a common series of shows, a common season of the series, a common director, a common production or a production company, a common genre or category, a common network or channel, or any other categorizing piece of metadata that the codebook and the incoming digital asset 215 may have a common association with. If a suitable codebook cannot be identified for an incoming digital asset 215, one or more codebooks trained based on a preceding digital asset (e.g., aired or streamed just prior to receipt of the current digital asset) can similarly be employed as the bootstrap codebook, among other variations. More importantly, a bootstrap codebook 265 is preferably employed, for at least the beginning portion(s) of the one or more incoming digital assets 215, to facilitate an immediate encoding of the one or more incoming digital assets 215 or digital asset portions as they are received.

Within a period in which the asset processing component 230 employs the bootstrap codebook to encode each beginning portion of the one or more incoming digital assets 215, the codebook training component 240 also instantiates and trains one or more new codebooks based on the beginning portion(s) of the one or more incoming digital assets 215 as they are received, thereby training one or more new codebooks based on one or more of the beginning portions. Like the asset processing component 230, the codebook training component 240 only trains each new codebook for a predefined period of time, which upon initialization, is for a duration associated with the beginning portion(s) of the one or more incoming digital assets 215. As is also noted herein, it is preferable that when multiple incoming digital assets 215 are employed to train a single codebook, that the incoming digital assets 215 have similar timelines (e.g., each digital asset or digital asset portion is processed in parallel). In some aspects, ensuring that each digital asset has a similar start and end time may facilitate such an implementation.

When the predefined period of time expires, each of the codebook training component 240 and asset processing component 230 continue their operations on immediately-subsequent portion(s) of the one or more incoming digital assets 215. More specifically, the asset apportioning component 220 provides the codebook training component 240 and asset processing component 230 with additional portion(s) of the sequentially-ordered data of the incoming one or more digital assets 215. In other words, the codebook training component 240 and asset processing component 230 begin performing their respective tasks on the sequentially-ordered data of the one or more incoming digital assets 215 for another duration corresponding to the predefined period of time.

At the moment of expiration (e.g., completing the training of a codebook for a particular digital asset portion), the codebook training component 240 provides the asset processing component 230 with the newly-trained codebook, such that the asset processing component 230 can encode the incoming portion of the incoming digital asset 215 with the newly-trained codebook. At the same time, the codebook training component 240 instantiates a new codebook and begins to train the new codebook based on the incoming portion(s) of the incoming one or more digital assets 215. The described process repeats until the either the one or more digital asset(s) are concluded (e.g., reach an end time of the asset) or an instruction to terminate the encoding process is received.

In some embodiments, after each new codebook is trained by codebook training component 240, the new codebook is communicated, by processing engine 210, for storage into a storage memory, such as the codebook and encoded asset data store 260. Each newly-trained codebook can correspond to one or more respective portion(s) (e.g., timeframe or frames) of one or more digital assets 215 and encoded versions thereof. In some embodiments, metadata can also be associated with each newly-trained codebook to facilitate identification and categorization for subsequent use (e.g., encoding, decoding).

In some embodiments, after each portion of the incoming one or more digital assets 215 is encoded, the encoded portion(s) are stored in or communicated to a reconstruction component 250. In an embodiment, the reconstruction component 250 can be, among other things, a cache memory in which the encoded portions of one or more digital assets 215 are stored and built upon to gradually build or generate one or more complete and fully-encoded digital assets. The processing engine 210 can then store the one or more fully-encoded assets with or associated with their corresponding codebooks in the codebook and encoded asset data store 260, for example.

In another embodiment, each encoded portion of a digital asset 215 can be individually stored by reconstruction component 250 and later reassembled in sequential order by the reconstruction component 250 to generate a single, fully-encoded digital asset. Similarly, the processing engine 210 can store each fully-encoded asset with or associated with its corresponding codebooks into the codebook and encoded asset data store 260. In another embodiment, the processing engine 210 may not have a reconstruction component 250, and each encoded portion of a digital asset can be stored in the codebook and encoded asset data store 260 along with its corresponding codebook trained by the codebook training component 240. More importantly, the encoded digital asset is stored in a memory with and/or associated with its respective codebook(s), such that a decoder (e.g., decoding engine 170 of FIG. 1) can reconstruct each encoded digital asset in response to a received instruction to provide the digital asset for presentation or other operation.

As can be appreciated by one of ordinary skill in the art, vector quantization in encoding/decoding applications comprises at least an encoder and a decoder. In simple terms, a digital asset can be broken down into input vectors. For each input vector, the encoder can read the input vector and output the index of the code word that offers the lowest amount of distortion. In some instances, the lowest distortion is determined by calculating the Euclidean distances between the input vector and each code word in the codebook. Upon determining the code word with the smallest Euclidean distance, the index of that code word is provided for recordation in an index file. The decoder, on the other hand, can read the index file and replace the recorded indices with the associated code word, thereby rebuilding the input vectors and ultimately reconstructing the digital asset.

In more detail, the method of encoding generally begins with an encoder, where each digital asset, such as digital asset 215 is in essence the source data. The source data can be in an encoded (e.g., mp4, f4v, mp3, etc.) or a decoded state. The source data can be processed within a vectorizer that breaks down the source data into input vectors. Vectorization is well-known in the art of digital media encoding, and additional detail will not be described herein. Utilizing an algorithm, such as vector quantization, each input vector is processed (e.g., analyzed, parsed, and/or mapped) to a codebook of vectors, such as codebook 270, that results in minimum error. When the input vector is encoded with the codebook, the closest code word is found such that the index of that code word is utilized to produce parts of an index file.

Upon the completion of the encoding process, all input vectors will have been encoded with at least one codebook and one index file. The codebook indices, also referred to as the index files, each represent a digital asset or a portion thereof. By using the indices of the codebook vectors instead of the input vectors, compression can be achieved. In some instances, the encoding process can produce residual errors. The residual errors can be stored in a single residual file or in separate residual files corresponding to each index file.

In accordance with some embodiments described herein, the processing engine 210 can receive one or more digital assets 215 in either an encoded or decoded state. Generally speaking, if a digital asset is continuously received (e.g., a stream), the digital asset 215 is likely in an encoded state. The codebook training component 240 utilizes an encoding algorithm, such as vector quantization, to map each input vector of the one or more digital assets 215 to a codebook, such as codebook 270. When an input vector is encoded with a codebook, the closest code word is found and the index of that code word is utilized to produce parts of an index file.

For example, the process of clustering input vectors to different groups based on a distance measure and choosing the centroid of that group as the codebook vector is used to train a codebook. However, in some embodiments, when a distance measure is above a certain threshold, a new codebook vector can be added. Moreover, by virtue of encoding portions of one or more digital assets, as performed by codebook training component 240, a suitable codebook 270 can be trained (e.g., generated) to effectively employ the codebook 270 for purposes of encoding immediately subsequent portion(s) of the same digital asset(s), which most likely have similar asset characteristics.

By way of an example implementation, a server device, such as server device 120 of FIG. 1, may receive a request from a client device, such as client device 180, requesting a recording (e.g., DVR) of a football game that is currently airing live. In conventional practices, the football game alone would be processed for a sufficient duration to train a codebook up to an appropriate amount before the codebook can be employed to encode the football game for potential storage. However, by employing the features described herein, the processing engine 210 can immediately begin encoding the football game as it is received, by employing a bootstrap codebook (e.g., bootstrap codebook 265), as described herein, for the beginning portion of the football game. Moreover, each subsequent portion can be encoded by employing a codebook trained based on the preceding portion of the football game. In some other embodiments described herein, each subsequent portion can be encoded by employing a codebook trained based on the preceding portion of multiple incoming digital assets determined to have similar asset characteristics. By virtue of employing a suitable bootstrap codebook and employing new codebooks trained based on preceding portions of one or more digital assets, one or more live digital assets, such as the example football game, can be encoded and stored with minimal to no latency.

Upon the completion of the encoding process, all input vectors will have been encoded with a plurality of codebooks and one or more index files. The index file(s), also referred to as the codebook indices, each represent a portion of a digital asset. By using the indices of the codebook vectors instead of the input vectors, compression is achieved. In some instances, the encoding process can produce residual errors. The residual errors can be stored in a single residual file or in separate residual files corresponding to each index file. Each trained codebook and encoded asset portions (e.g., codebook indices) along with any residual files can be stored in a data store, such as codebook and encoded asset data store 160, 260.

With quick reference back to FIG. 1, the decoding engine 170 can decode digital asset for purposes of streaming the digital asset to the client device 180. In an embodiment, the decoding engine 170 decodes the digital asset in response to a request, received from the client device 180, to access or view the digital asset. The decoding engine 170 can essentially reconstruct an encoded digital asset by locating code words in the trained codebook(s), as defined by one or more index files corresponding to the digital asset. It is contemplated that in some embodiments, the decoding engine 170 can include a re-ordering component (not shown) that essentially reverses the break down process previously performed by the vectorizer described herein above. Each vector can be reassembled into an original state (e.g., motion vectors, coefficients, etc.) that the digital asset was in, prior to encoding. Ultimately, the decoding engine 170 performs the requisite steps to decode the encoded asset into a reconstructed digital asset for distribution to the client device 180.

Figure 3:
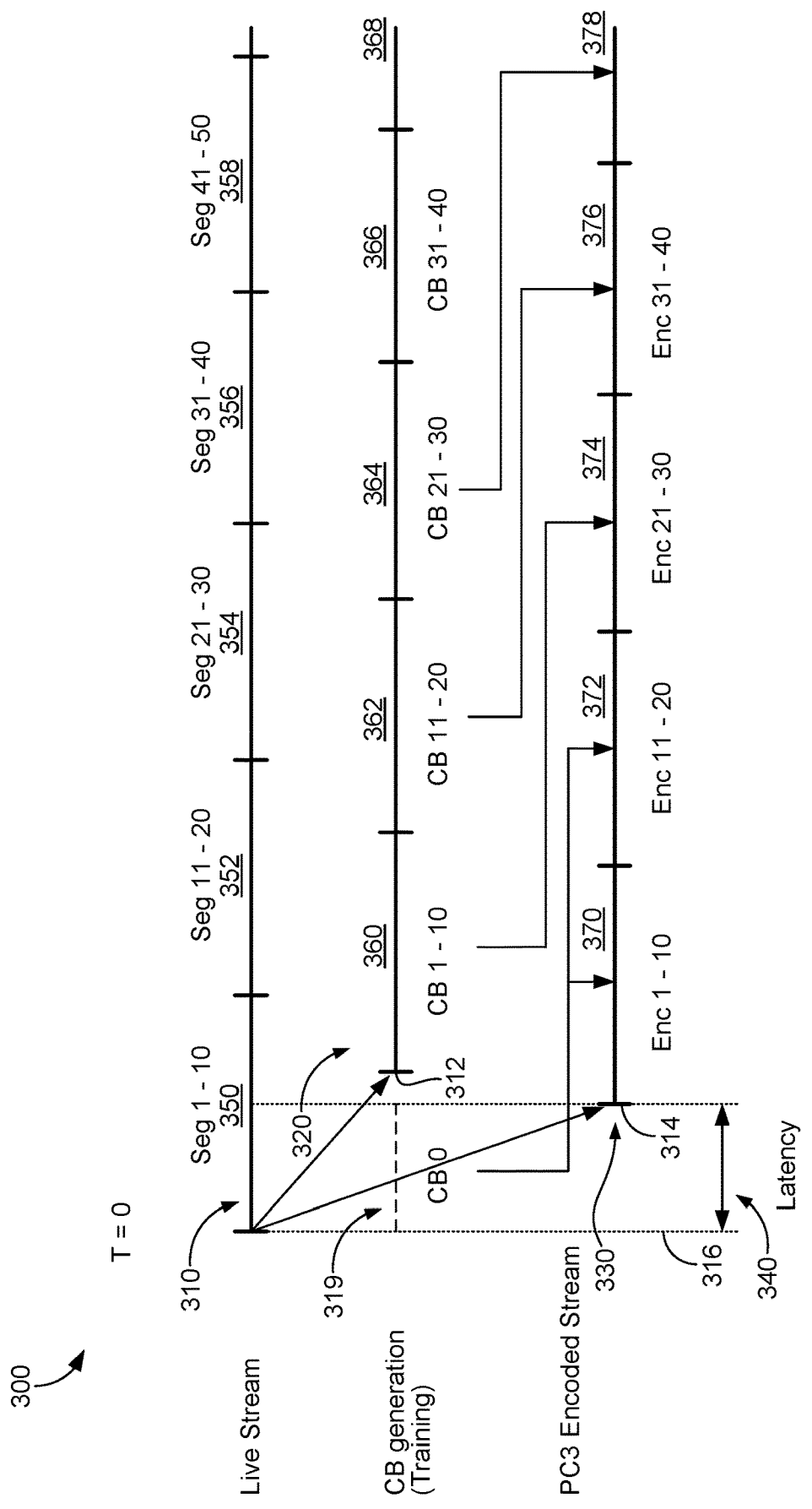
FIG. 3 illustrates an exemplary relational timeline of operations performed by an asset processing engine in accordance with an embodiment of the present disclosure.

With brief reference to FIG. 3, an exemplary relational timeline 300 is provided that shows relative timeline relationships between receiving portions of an incoming live stream 310 (e.g., a digital asset), codebook generation 320 based on the received portions, and an encoding 330 of received portions of the incoming live stream. The depicted relational timeline 300 merely illustrates exemplary relationships between the foregoing operations 310, 320, 330 in accordance with an exemplary embodiment of the present disclosure, and is not intended to be limiting in any way. Although not depicted in the figures, in accordance with other embodiments described herein, a plurality of incoming live streams 310 may be employed to train a codebook or codebook portion for the incoming live stream 310. Many potential relative temporal relationships can be foreseen within the purview of the present disclosure, including those resulting in a greater or lesser amount of latency 340 between any of the operations described herein.

The timeline 300 includes an incoming live stream 310 timeline that depicts a start time of a live media stream being received starting at time 312 ("T=0") by a processing engine, such as processing engine 140, 210. As indicated, the live stream timeline 310 is divided for purposes of illustrating sequential live stream portions 350, 352, 354, 356, 358 that each include ten sequentially-ordered segments of a digital asset. The live stream portions 350, 352, 354, 356, 358 depicted here may or may not be physically segmented, depending on implementation and file formats. For purposes of illustrated, the segments are marked to show consecutive portions of the live media stream on which the codebook generation 320 and live stream encoding 330 operations are performed in accordance with some embodiments described herein. Each live stream portion and/or segment 350, 352, 354, 356, 358 can be equal in time, similar in time, or different in time, depending on various implementations of the present disclosure. For instance, if each live stream portion 350, 352, 354, 356, 358 and/or segment is defined by a predefined period of time (e.g., 15 seconds), then the live stream portions 350, 352, 354, 356, 358 and/or segments can be marked equal or similar (e.g., within 3 seconds) in time. If, however, the live stream portion 350, 352, 354, 356, 358 and/or segment is defined by a dynamically-defined period of time based on, for instance, a status (e.g., completion or threshold percentage) of codebook generation 320 or live stream encoding 330 operations, then the live stream portions 350, 352, 354, 356, 358 and/or segments can be different or also similar in time.

Moving on to the codebook generation timeline 320, codebook training for at least the first codebook "CB 1" starts at time 316, showing that generation (i.e., training) of a first codebook begins when live stream first portion 350 begins. As depicted, the codebook training start time 316 occurs as (e.g., while, during, at a time when, within a duration of) the first portion 350 is received. At least codebook "CB 1" can be written (e.g., produced) at time 312, such that it can be employed to encode subsequent portions of the live stream.

In accordance with an embodiment described herein, duration 319 illustrates a first duration that a bootstrap codebook, such as bootstrap codebook 265 of FIG. 2, can be employed by an asset processing component, such as asset processing component 150, 230, to encode a piece of live stream first portion 350 starting at time 316, in contrast to conventional systems which require a latency period 340 associated with the generation of a codebook based on the live stream first portion 350.

Looking now at encoding timeline 330, the encoding of live stream first portion 350 begins at time 316. As described herein, the encoding process of an incoming digital asset in accordance with embodiments of the present disclosure can start "on the fly," with significantly less latency than conventional methods that rely on codebook generation prior to an initiation of the encoding process. The latency duration 340 here depicts a duration between a time at which encoding begins (time 316) and a time that the first encoded bits are available (time 314). By virtue of employing a bootstrap codebook to encode live stream first portion 350, the encoding begins with a significantly less latency than conventional techniques, which would likely occur long after time 312 when codebook training completes.

Shortly after time 314, when the first encoded bits become available and as the live stream first portion 350 is still being received, time 312 indicates when the codebook that was trained starting at time 316 is written or produced. As described herein, a codebook can be trained as a portion of the live stream is received, and in parallel, the same portion of the live stream can also be encoded. This "moving window" approach of codebook generation and encoding, as described herein, is consistently repeated throughout a duration of the live stream until either the live stream is completed, interrupted, or terminated.

As illustrated and described herein, live stream portions 350, 352, 354, 356, 358 are each received in sequence by a processing engine. During a first period in which live stream first portion 350 is received, the live stream first portion 350 can start being encoded in period 370 by employing a bootstrap codebook "CB 0" 319. Also during a portion of period 370, one or more codebooks "CB 1-10" can start being trained and or produced during period 360 based on the live stream first portion 350. In some embodiments, the bootstrap codebook 319 can be employed to encode additional live stream portions 370, 372 until an appropriate codebook is trained to encode further subsequent portions of the live stream.

Codebooks, such as codebooks 1-40 can continue to be trained and/or produced, without interruption, as the live stream is received, such as during periods 360, 362, 364, 366. Also during this these periods, these codebooks can be employed to encode subsequent live stream portions as they are received. In accordance with various embodiments described herein, the staggered operations are similarly performed on live stream periods until the live stream reaches an end or an instruction to stop the aforementioned operations is received.

Figure 4:
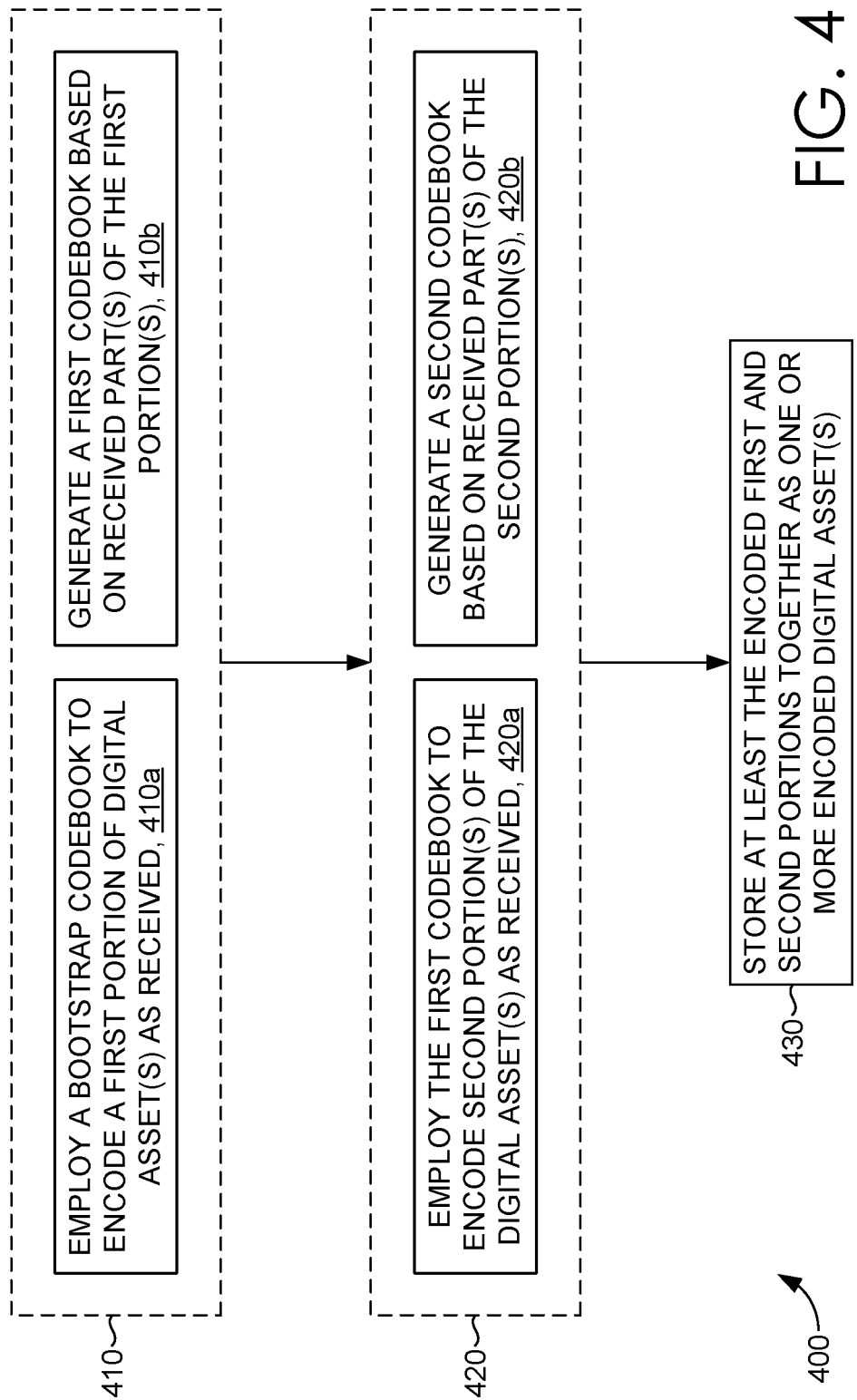
FIG. 4 illustrates a process flow depicting an example method for mitigating latencies associated with media encoding, in accordance with some embodiments of the present disclosure.

Looking now to FIG. 4, a flow diagram is provided that shows an example process flow 400 for mitigating codebook training latencies when encoding digital assets. In FIG. 4, various steps described herein are performed in parallel, or simultaneously, to facilitate the mitigation of latencies typically associated with codebook training and employment for purposes of encoding and storage, among other things. Each of the steps described in accordance with steps 410 and 420 can be performed for a predefined (e.g., fixed) duration of time, or a dynamically determined duration of time, and repeated on different portions of a digital asset until either a final portion of the digital asset is received, a command is received to terminate the encoding process, or a rules-based operation or command is received.

At step 410a, a bootstrap codebook is employed by an processing engine, such as processing engine 140, 210, or a component thereof, such as asset processing component 150, 230 to encode beginning (i.e., first) portion(s) of one or more digital assets as the beginning portion(s) are received. The bootstrap codebook can be any previously-trained codebook stored in a memory and available to be employed by the processing engine to encode at least the beginning portion(s) of one or more digital assets as they are initially received by (e.g., streamed to) the processing engine.

Preferably, the bootstrap codebook was trained based on one or more different digital assets with content having similar characteristics (e.g., production style, rhythm, color scheme, motion vectors, location, genre) as the digital assets being encoded. In this way, the bootstrap codebook can serve as a suitable codebook such that the processing engine or component can efficiently encode a subsequent portion of the digital asset when or as it is received. As described herein, various codebooks previously trained and associated with other encoded digital assets can be stored in a memory. In some aspects, the memory can be searched by the processing engine to determine a suitable bootstrap codebook to encode at least the beginning portion(s) of the one or more digital assets. In some embodiments, the suitable bootstrap codebook can be searched based on metadata associated with the stored codebook and/or its corresponding stored encoded digital asset(s). Preferably, the processing engine can identify a high likelihood of suitability based on matching metadata or a high correlation between the incoming digital asset(s) and one of the stored codebooks.

At step 410b, a first codebook is trained by the processing engine or another component thereof, such as codebook training component 155, 240. The first codebook is trained based on data associated with the beginning portion(s) of the one or more digital asset(s) as they are received. In other words, sequentially-ordered portion(s) after the beginning portion(s) of the digital asset are received by the processing engine. When the portion(s) are received, the processing engine or other component can instantiate a new codebook and initiate an encoding algorithm, such as vector quantization, to train the new codebook. The new codebook is trained by virtue of the training process utilizing the sequentially-ordered data to train a codebook based on the data as it is received.

When the beginning portion of the digital asset is encoded, in step 420a the processing engine or component can employ the new codebook that was trained in step 410b and based on the beginning portion of the digital content. In this way, the processing engine can employ a codebook that was encoded based on a portion of content that would be suitable to encode a subsequent (e.g., second) portion of the same content. In other words, the processing engine can employ a codebook that was trained based on a preceding portion of a digital asset to encode a currently-received portion of the digital asset. As the digital asset corresponds to one particular piece of content, the likelihood that any codebook trained based on a portion of content stored therein will be suitable for encoding other portions of the same content, particularly for immediately-consecutive portions.

Once again, similar to step 420a, a second codebook is trained by the processing engine. The second codebook is trained based on data associated with the second portion or other portions of the digital asset as it is received. Similar to the beginning portion, sequentially-ordered pieces of the second portion of the digital asset are received by the processing engine. When the pieces are received, the processing engine can instantiate a second new codebook to be trained based on the received pieces of the second portion. The second codebook is trained by virtue of the training process utilizing the sequentially-ordered data to train a codebook based on the data as it is received.

In various embodiments, the described features of training a codebook based on an incoming or received portion of a digital asset, employing that codebook to encode a subsequent portion of the digital asset while also training another codebook based on the subsequent portion of the digital asset, can be imagined as somewhat of a shifting and passing pattern that describes various embodiments of the present disclosure. As described herein, the staggered nature of codebook training and encoding assets as they are received facilitate the mitigation of latencies associated with codebook training, encoding, storage, and/or decoding of digital assets.

At step 430, the processing engine stores, among other things, the encoded first and second portions of the digital asset in a memory, such as codebook and encoded asset data store 160, 260, together as a singular encoded digital asset. It is contemplated that all portions of the digital asset, once encoded, will be stored as one encoded digital asset. It is further contemplated that each codebook trained based on each portion of the digital asset can also be stored in the memory, which in some embodiments may be required for a subsequent decoding of one or more portions of the digital asset. In another embodiment, it is contemplated that each encoded portion of the digital asset can be stored as separate encoded pieces of the digital asset that are stored in sequence, such that when decoded sequentially in sequence, the playback will appear as one seamless digital asset. It is contemplated that many variations of how the encoded portions and trained codebooks are stored and retrieved may exist, and although they are not described herein, such variations are considered to remain within the purview of the present disclosure.

Figure 5:
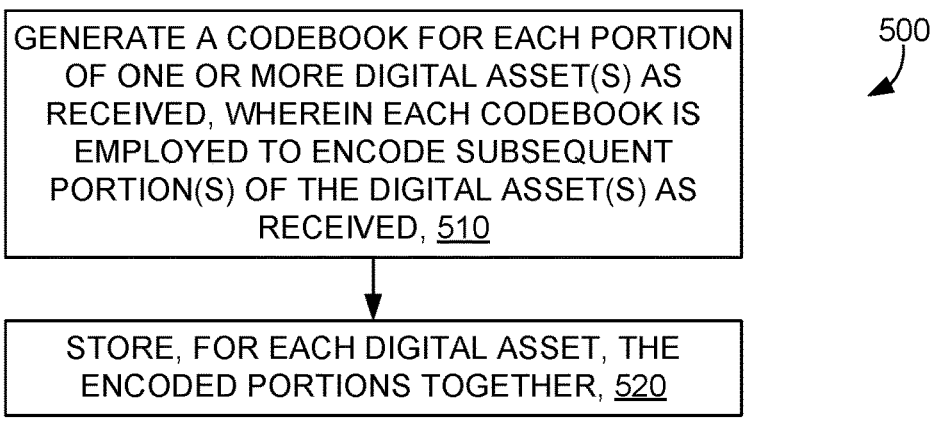
FIG. 5 illustrates a process flow depicting an example method for mitigating latencies associated with media encoding, in accordance with some embodiments of the present disclosure.

Looking now to FIG. 5, a flow diagram is provided that shows an example of a process flow 500 for mitigating codebook training latencies when encoding digital assets. FIG. 5, like FIG. 4, describes steps for facilitating the mitigation of latencies typically associated with codebook training and employment for purposes of encoding and storage, among other things. Step 510 can be performed for a predefined (e.g., fixed) duration of time, and repeated on each portion of one or more digital assets until either final portion(s) of the digital asset(s) is received and encoded, a command is received to terminate the encoding process, or a rules-based operation or command is received.

At step 510, one or more live digital asset, such as via a digital stream, is continuously received by a processing engine, such as processing engine 140, 210. As the digital asset(s) are received, equal portions of the digital asset(s) are encoded, portion by portion, based on previously-trained codebooks. With the exception of a beginning (i.e., first portion) of the digital asset, a codebook is trained (i.e., trained) by the processing engine or another component thereof, such as codebook training component 155, 240, as each portion of the digital asset is received. When a codebook is trained, the trained codebook is employed by the processing engine to encode a subsequent portion of the digital content as it is received. At the same time, another codebook is trained by the processing engine as the subsequent portion of the digital content is received. The encoding step, along with the codebook training step, are performed in parallel and repeated for each portion until a final portion of the digital asset is received and encoded, or an instruction is received to terminate the encoding process.

At step 520, the processing engine stores, among other things, the encoded portions of the digital asset(s) in a memory. In a preferred embodiment, it is contemplated that all portions of the digital asset(s), once encoded, will be merged and stored together in sequence as reconstructed encoded digital asset(s). In a further embodiment, each codebook trained based on each portion of the digital asset can also be stored in the memory, which is required for a subsequent decoding of one or more portions of the digital asset. In another embodiment, it is contemplated that each encoded portion of the digital asset(s) can be stored as separate encoded pieces of the digital asset(s), such that when decoded in sequence, the playback will appear as one seamless digital asset for any one particular digital asset. It is contemplated that many variations of how the encoded portions and codebooks are stored and retrieved may exist, and although they are not described herein, such variations are considered to remain within the purview of the present disclosure.

Having described embodiments of the present disclosure, an exemplary operating environment in which embodiments of the present disclosure can be implemented is described below in order to provide a general context for various aspects of the present disclosure. Referring to FIG. 5, an illustrative operating environment for implementing embodiments of the present disclosure is shown and designated generally as computing device 500. Computing device 500 is but one example of a suitable computing environment and is not intended to suggest any limitation as to the scope of use or functionality of the invention. Neither should the computing device 500 be interpreted as having any dependency or requirement relating to any one or combination of components illustrated.

Embodiments of the present disclosure can be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. Embodiments of the present disclosure may be practiced in a variety of system configurations, including hand-held devices, consumer electronics, general-purpose computers, more specialty computing devices, etc. Embodiments of the present disclosure may also be practiced in distributed computing environments where tasks are performed by remote-processing devices that are linked through a communications network.

Figure 6:
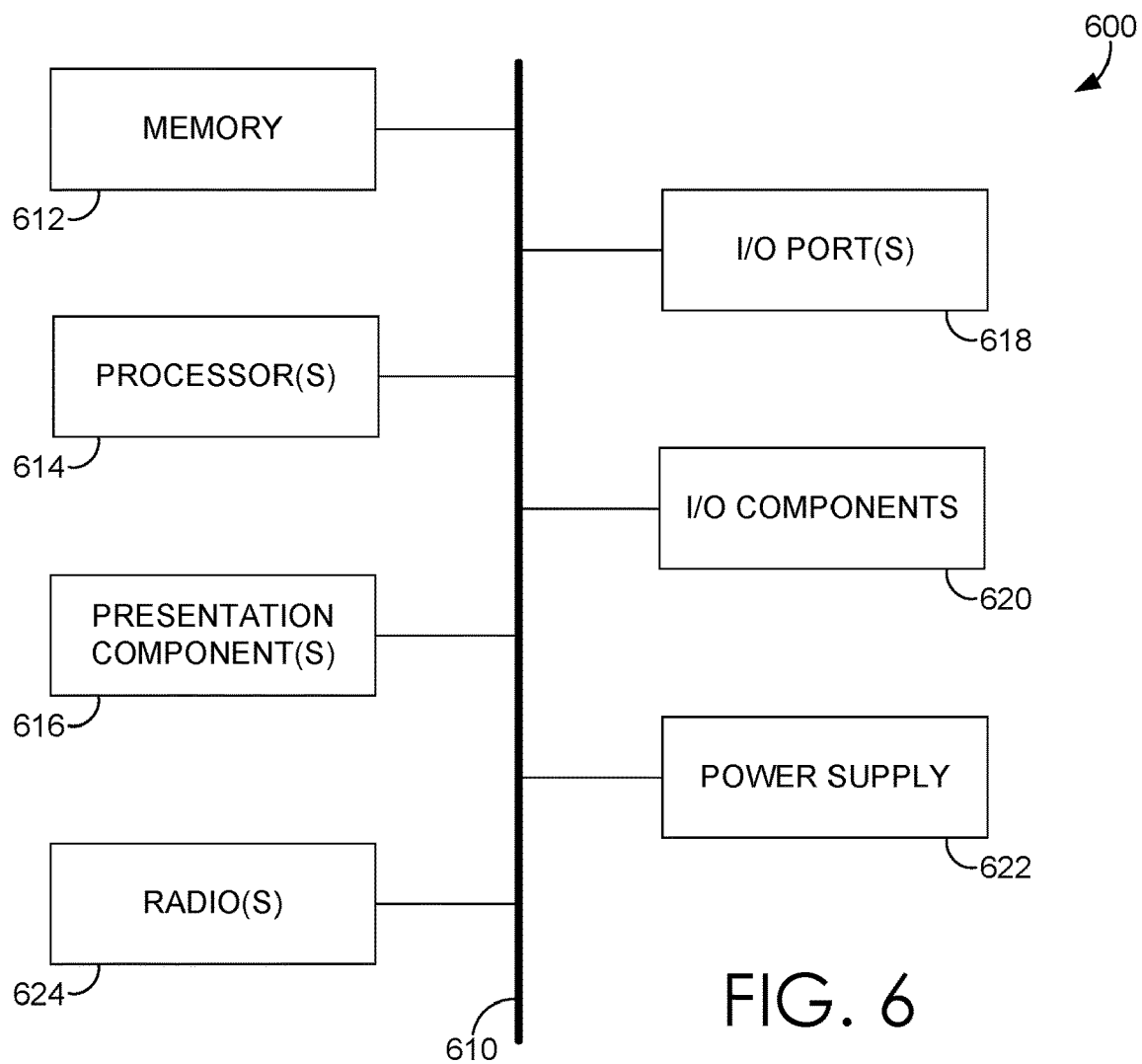
FIG. 6 is a block diagram of an example computing device in which some embodiments of the present disclosure may be employed.

With reference to FIG. 6, computing device 600 includes a bus 610 that directly or indirectly couples the following devices: memory 612, one or more processors 614, one or more presentation components 616, input/output (I/O) ports 618, input/output components 620, and an illustrative power supply 622. Bus 610 represents what may be one or more busses (such as an address bus, data bus, or combination thereof). Although the various blocks of FIG. 6 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventor recognizes that such is the nature of the art, and reiterates that the diagram of FIG. 6 is merely illustrative of an exemplary computing device that can be used in connection with one or more embodiments of the present disclosure. Distinction is not made between such categories as "workstation," "server," "laptop," "hand-held device," etc., as all are contemplated within the scope of FIG. 6 and reference to "computing device."

Computing device 600 typically includes a variety of computer-readable media. Computer-readable media can be any available media that can be accessed by computing device 600 and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 600. Computer storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 612 includes computer-storage media in the form of volatile and/or nonvolatile memory. The memory may be removable, non-removable, or a combination thereof. Exemplary hardware devices include solid-state memory, hard drives, optical-disc drives, etc. Computing device 600 includes one or more processors that read data from various entities such as memory 612 or I/O components 620. Presentation component(s) 616 present data indications to a user or other device. Exemplary presentation components include a display device, speaker, printing component, vibrating component, etc.

I/O ports 618 allow computing device 600 to be logically coupled to other devices including I/O components 620, some of which may be built in. Illustrative components include a microphone, joystick, game pad, satellite dish, scanner, printer, wireless device, etc. The I/O components 620 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 600. The computing device 600 may be equipped with depth cameras, such as stereoscopic camera systems, infrared camera systems, RGB camera systems, touchscreen technology, and combinations of these, for gesture detection and recognition. Additionally, the computing device 600 may be equipped with accelerometers or gyroscopes that enable detection of motion. The output of the accelerometers or gyroscopes may be provided to the display of the computing device 600 to render immersive augmented reality or virtual reality.

Embodiments presented herein have been described in relation to particular embodiments which are intended in all respects to be illustrative rather than restrictive. Alternative embodiments will become apparent to those of ordinary skill in the art to which the present disclosure pertains without departing from its scope.

From the foregoing, it will be seen that this disclosure in one well adapted to attain all the ends and objects hereinabove set forth together with other advantages which are obvious and which are inherent to the structure.

It will be understood that certain features and sub-combinations are of utility and may be employed without reference to other features or sub-combinations. This is contemplated by and is within the scope of the claims.

In the preceding detailed description, reference is made to the accompanying drawings which form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the preceding detailed description is not to be taken in a limiting sense, and the scope of embodiments is defined by the appended claims and their equivalents.

Various aspects of the illustrative embodiments have been described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features have been omitted or simplified in order not to obscure the illustrative embodiments.

Various operations have been described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, descriptions of operations as separate operations should not be construed as requiring that the operations be necessarily performed independently and/or by separate entities. Descriptions of entities and/or modules as separate modules should likewise not be construed as requiring that the modules be separate and/or perform separate operations. In various embodiments, illustrated and/or described operations, entities, data, and/or modules may be merged, broken into further sub-parts, and/or omitted.

The phrase "in one embodiment" or "in an embodiment" is used repeatedly. The phrase generally does not refer to the same embodiment; however, it may. The terms "comprising," "having," and "including" are synonymous, unless the context dictates otherwise. The phrase "A/B" means "A or B." The phrase "A and/or B" means "(A), (B), or (A and B)." The phrase "at least one of A, B and C" means "(A), (B), (C), (A and B), (A and C), (B and C) or (A, B and C)."

The subject matter of the present disclosure is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A non-transitory computer storage medium storing computer-useable instructions that, when used by one or more computing devices, cause the one or more computing devices to perform operations for mitigating data encoding latencies comprising:
   identifying a characteristic of a first digital asset as an initial segment in a plurality of segments of the first digital asset is received;
   selecting a bootstrap codebook based on the identified characteristic of the first digital asset, the selected bootstrap codebook having been trained based on a different digital asset with the identified characteristic;
   encoding the initial segment of the first digital asset with the bootstrap codebook as the initial segment is received;
   training a first codebook based on the initial segment of the first digital asset as the initial portion is received and encoded;
   employing the trained first codebook to encode a second segment of the first digital asset as the second segment is received immediately following the initial segment, wherein a second codebook for encoding a third segment of the first digital asset is trained based at least in part on the second segment as the second segment is received and encoded; and
   storing at least the encoded initial and second segments of the first digital asset together in sequence as one encoded digital asset.

2. The non-transitory computer storage medium of claim 1, wherein the different digital asset is at least one of a prior episode of the first digital asset, a prequel of the first digital asset, or a sequel of the first digital asset.

3. The non-transitory computer storage medium of claim 1, wherein the different digital asset is associated with at least one of a common producer of the first digital asset, a common genre or category of the first digital asset, or a common network or channel of the first digital asset.

4. The non-transitory computer storage medium of claim 1, wherein the first digital asset includes live content.

5. The non-transitory computer storage medium of claim 1, wherein the first digital asset corresponds to a single production.

6. The non-transitory computer storage medium of claim 1, wherein the first codebook and the second codebook are trained based further in part on respective segments of a second digital asset.

7. The non-transitory computer storage medium of claim 1, wherein each of the initial and second segments of the first digital asset have a common duration.

8. The non-transitory computer storage medium of claim 1, wherein the first digital asset is already encoded.

9. The non-transitory computer storage medium of claim 1, wherein each segment of the first digital asset is received via at least one of a streaming server, a digital tuner device, a digital converter device, and a network connection.

10. A computerized system for mitigating data encoding latencies, the system comprising:
    a processor; and
    computer-storage media storing computer-useable instructions that, when used by the processor, cause the processor to:
    identify a characteristic of a first digital asset as an initial segment in a plurality of segments of the first digital asset is received;
    select a bootstrap codebook based on the identified characteristic of the first digital asset, the selected bootstrap codebook having been trained based on a different digital asset with the identified characteristic;
    encode the initial segment of the first digital asset with the bootstrap codebook as the initial segment is received;
    train, as the initial segment is received and encoded, a first codebook that corresponds to and is trained based on the initial segment;
    employ, as a second segment immediately following the first segment is received, the trained first codebook to encode the second segment; and
    store at least the initial and second encoded segments together, in sequence, as one encoded segment of the first digital asset.

11. The computerized system of claim 10, wherein at least the first digital asset is already encoded.

12. The computerized system of claim 10, wherein the first digital asset includes live content.

13. The computerized system of claim 10, wherein each segment of the plurality of segments has a common duration.

14. A computerized method for mitigating data encoding latencies, the method comprising:
    identifying a characteristic of a first digital asset as an initial segment in a plurality of segments of the first digital asset is received;
    selecting a bootstrap codebook based on the identified characteristic of the first digital asset, the selected bootstrap codebook having been trained based on a different digital asset with the identified characteristic;
    encoding the initial segment of the first digital asset with the bootstrap codebook as the initial segment is received;

training, as the initial segment is received, a first codebook that corresponds to and is trained based on the initial segment;

employing, as a second segment of the first digital asset is received immediately following the initial segment, the trained first codebook to encode the second segment, wherein a second codebook for encoding a third segment immediately following the second segment is trained based at least in part on the third segment as the third segment is received and encoded; and storing at least the encoded initial and second segments together, in sequence, as one encoded segment of the first digital asset.

15. The method of claim 14, wherein the first digital asset includes live content.

\* \* \* \* \*